United States Patent [19]

Leslie et al.

[11] Patent Number: 5,077,671
[45] Date of Patent: Dec. 31, 1991

[54] TEST CART FOR AIRCRAFT CONTROL SURFACE MEASUREMENTS

[75] Inventors: Daniel D. Leslie, Everett; Mark J. Humphrey, Renton; Ted E. Rogers, Puyallup; Lyal K. Schlotterbeck, Renton; Lynn Seegmiller, Auburn; Andrew L. West, III, Kent, all of Wash.

[73] Assignee: The Boeing Company, Seattle, Wash.

[21] Appl. No.: 375,870

[22] Filed: Jul. 5, 1989

[51] Int. Cl.5 ............................................. G06F 15/20
[52] U.S. Cl. ......................... 364/424.03; 364/424.04; 324/73.1; 371/15.1
[58] Field of Search ........................ 364/424.01, 424.03, 364/424.04, 578, 431.01, 550, 551.01, 579, 580; 371/15.1; 324/73.1

[56] References Cited

U.S. PATENT DOCUMENTS

| | | | |
|---|---|---|---|
| 4,454,588 | 6/1984 | O'Brien | 364/579 |
| 4,626,996 | 12/1986 | Arlott | 364/550 |
| 4,841,456 | 6/1989 | Hogan, Jr. et al. | 364/550 |
| 4,852,031 | 7/1989 | Brasington | 364/578 |
| 4,908,782 | 3/1990 | Pekarek et al. | 364/550 |

Primary Examiner—Gary Chin
Attorney, Agent, or Firm—Bruce A. Kaser

[57] ABSTRACT

A test cart automatically measures the full range of motion of cockpit controls and the full range of responsive motion of airplane ailerons, rudder, elevators, spoilers, stabilizer and flaps/slats. A computer is electrically linked to these devices and automatically plots cockpit control motion, and responsive control surface motion, in order to determine that control surfaces function properly during aircraft assembly.

14 Claims, 10 Drawing Sheets

TEST CART FOR AIRCRAFT CONTROL SURFACE MEASUREMENTS

1. Technical Field

This invention relates to computer-controlled testing of systems where a computer senses and assimilates test data. More particularly, it relates to testing of this type in the field of aircraft manufacturing.

2. Background Information

The smooth, fluid motion of commercial airplane depends on controlled coordination of the various control surfaces on the wings and empennage. As would be familiar to a person knowledgable in the way an airplane flies, such surfaces include movement of airplane rudder, ailerons and elevators. As would also be familiar, the typical commercial airplane also has spoilers, stabilizers and flaps and/or slats which are used at various times to control airplane flight.

It is important to conduct functional tests of these various surfaces during airplane manufacturing, and prior to customer delivery, in order to determine that each will respond precisely to pilot control. Otherwise, the airplane may not fly properly.

In the past, individual control surfaces were functionally tested by first manually moving them to certain specified static positions. Such movements were accomplished, of course, by simultaneously moving certain airplane controls such as rudder pedals, control column wheel or the control column itself. For example, pushing or otherwise moving rudder pedals causes a corresponding rudder movement.

In order to ensure that these systems were operating correctly, manual measurements of both control movement and responsive control surface deflection were manually measured, typically by using a conventional carpenter's measuring tape. The results were then interpreted, and recorded by hand-made entries, all of which was a laborious process that had to be repeated for each surface on the airplane and for each airplane manufactured.

The airplane manufacturer typically develops a set of test requirements or criteria for functional tests of control surfaces. These requirements are periodically reviewed and revised prior to final approval. This involves many transfers of large amounts of paperwork from one engineering group to another. Sometimes test criteria are computerized, making the review and revision process easier. In such cases, however, it is still necessary for computer experts to transfer test requirements onto software, and to make subsequent revisions. Regardless of the degree of computerization, in all cases the manufacturer maintains complete records of all test requirements which are kept in hard copy form. This creates a large amount of material that takes up storage space.

The present invention is an automated control surface measurement system (CSMS) which resides in a test cart. It provides the manufacturer with the capability of significantly improving the qualitative nature of functional tests of control surfaces while eliminating the quantity of paperwork associated with outmoded and cumbersome record-keeping procedures.

The test cart is an automated test system that is tied directly into an airplane under test by cables and tubing. It is connected to onboard sensors at the airplane's electrical and electronics bay, cargo bay, and to the control column and rudder pedals in the cockpit (for both pilot and first officer). The cart's computer is directly tied to these systems and receives electrical signals from them indicating control movements, i.e. movement of the control column, column wheel, rudder pedals, etc. and responsive movement of control surfaces to these movements.

In the past, a control surface had to be static (i.e. nonmoving) before a measurement could be taken. Therefore, the position of the surface was measured only at the outer extremes of its range of motion. The test cart of the present invention provides continuous measurement and recordation of data through the entire arc of motion. The result is that any anomolies which were formerly hidden can now be identified thus enabling early correction while the airplane is still in the factory.

During actual flight conditions, the degree of deflection of a control surface varies with airplane speed. In order to accurately test deflection, the test cart is further equipped with a computer-controlled supply of compressed air which is supplied directly to the airplane's airspeed indicator pitot pickup tube. Varying the air supply consequently simulates different airspeed conditions. This permits dynamic testing of control surface response which can simulate, for example, surface response in a particular turning maneuver just as though the airplane is actually flying, although the plane remains on the floor of the manufacturer's facility.

As should be self-evident after reviewing the preceding information, the object of the invention disclosed herein is twofold: First, the invention provides improved functional test capability which consequently makes for higher quality in the finished product. In this case, commercial airplanes are the finished product and, naturally, product quality has tremendous importance with respect to safety. Second, the invention is an automated system which provides substantial savings in labor and data processing costs for each airplane upon which the invention is utilized.

The concept of using computers to control tests is admittedly not new. There is a wealth of prior art where computers have been used to conduct and/or automatically control tests. Like the present invention, the impetus leading to the creation of these systems is that they provide higher quality tests and reduce labor and data processing costs. Thus, it can be said that there is an obvious need for these kinds of systems to be implemented in many different kinds of manufacturing situations or environments, including airplane control surface testing. Nevertheless, recognizing the need is far different from reducing a needed system to practice, or otherwise making a system that works for its intended purpose. Most prior art systems of the type which are similar to the present invention have their own unique characteristics which create unique problems in their reduction to practice. Here, the invention relates to a system that tests aircraft control surfaces. Such surfaces have their own unique design characteristics and, hence, their own test criteria. It is believed that nowhere in the prior art is there an equivalent system which can perform the same kinds of tests, in the same way, as does the invention claimed herein.

SUMMARY OF THE INVENTION

The invention is a control surface measurement system housed in a test cart. It measures the physical movement of airplane ailerons, rudders, elevators, spoilers, stabilizers, and flaps/slats in response to movements of the controls for each respective surface. It also tests autopilot controls of these surfaces and controls hydraulic fluid pressure to the actuators which move these surfaces. With respect to the latter, and as a person skilled in the art would know, an airplane's hydraulic systems derive their pressure from power that is supplied by the airplane's engines. It is impractical or impossible to operate these systems via engine power while the airplane is under assembly. Therefore, in order to test control surfaces, auxiliary hydraulic pressure must be supplied from an independent source. This independent source is controlled by the test cart disclosed herein.

The cart includes a data acquisition computer housed in the test cart. This device is connected via umbilicals to both cockpit controls and control surfaces. More specifically, the umbilicals operatively connect the computer to certain conventional electromechanical sensors which output signals indicating control device movements, i.e. control column and wheel movements, rudder pedal movements, and stabilizer trim/flap lever movements. Similarly, sensors connected to the various control surfaces described above, which respond to control device movements, provide electrical signals indicating the magnitudes of responsive movement of the surfaces. The computer is programmed to receive test instructions from the user, and to receive and assimilate into test data movements and forces acting on the various control devices just described, and responsive control surface movements. This is done for the entire range of both control device motion and control surface motion.

Although the cart houses conventional input and output devices such as a keyboard, computer display monitor and impact printer for viewing test information and data, the cart also includes two other CRT monitors having touch screens for use in inputting and receiving instructions during tests. One such monitor is remotely located in the aircraft cockpit. This device permits the user to conduct a test from the cockpit. The other is housed in the cart itself.

The test cart also has an intercom system operated by the data acquisition computer which audibly communicates to the test cart user(s) via headset. This system provides the user with audible warnings when a control surface under test is about to be moved and/or audibly prompts the user to do certain things. The intercom system also permits one user to voice communicate with another through headsets.

The cart is linked via modem to an off-site location to where data can be sent after airplane testing and from where test programs can be released directly to the cart. The advantage to this is that it reduces paperwork and provides for quick and timely release of test programs.

The test cart system consists of substantially for major sections: One is the test cart itself; the second is the equipment which interfaces the test cart to cockpit controls; the third is the equipment which interfaces the test cart to the airplane's electrical and electronics bay; and the fourth is the equipment which interfaces the cart to equipment in the cargo bay. The required hardware to operate the system resides in the cart and includes the following major groups of items: (1) the data acquisition computer mentioned above, including keyboard and monitor; (2) CRT touch screens for easy test control; (3) a disc drive for data and software storage; (4) variable and fixed power supplies for normal operation and certification; (5) a pneumatic controller for simulating air speed at the airplane's pitot tubes; (6) CDS ARINC 429 cards for receiving and transmitting compatible 429 signals; (7) built-in calibration/certification equipment to certify test system accuracy; (8) a CDS arbitrary wave autopilot servos; (9) breakout connections that allow troubleshooting access to all airplane signals which are transmitted to the cart; (10) a clock for time and date stamping of test data; (11) an intercom which allows communication between the test cart and test operators, and between test operators; (12) a voice synthesizer which is connected into the intercom and provides audible warnings to test operators when the test cart's computer is about to move an airplane control surface.

The test cart is linked to the airplane by a set of umbilical cables. One cable connects the cart to the above-described cockpit control devices. As would be known, the cockpit contains redundant control devices, one for the captain or pilot, and the other for the first officer or co-pilot. Located in the cockpit are two cockpit interface assembly boxes which respectively link a cart umbilical to the captain's and first officer's control devices. Each interface assembly box has electromechanical linkages which utilize rotational variable differential transducers (RVDTs) to create electrical signals that indicate physical movements of the cockpit control devices. Further, these interface assembly boxes are electrically linked to strain gauge force transducers which sense the various forces acting on the control devices while they are moved. In this fashion, the test cart can, at the same time, monitor the position of cockpit control devices, the force applied to them, and the position of the particular control surface movements which are commanded by the cockpit controls.

By way of example, the captain's control column is electromechanically connected to its respective cockpit interface assembly box and to the test cart via an umbilical and the data acquisition computer tracks the control column's forward and aft movement while at the same time senses the amount of elevator movement in response to control column movement. At the same time, the computer monitors the forces acting on the column as a result of such action. All of these actions are graphically traced by the test cart's computer and are recorded as test data in the computer's memory. Thus, the position of the control device and the responsive position of the control surface is measured through their respective full ranges of motion. The same is accomplished for each and every one of the other airplane control surfaces and their respective control devices.

Since the invention is in the form of a cart, it can be positioned virtually anywhere on an airplane assembly line. Airplane testing using the cart may be remotely controlled by the user from the cockpit through the previously-mentioned remotely-located CRT terminal. As the user moves through a particular test step-by-step, the cart provides all the necessary instructions to the user for adjusting any onboard systems for each particular test. The user can quickly and easily move from one control surface test to another, and can move forward or backward during a series of tests by employing touch control on the screen of the CRT monitor. At the conclusion of each test, the cart's computer stores all test data and plots test results.

The particular kinds of tests involved in using the cart are easy to program or reprogram by the engineer who is most familiar with these tests, and can be done in terms of using plain, simple English that is easy to understand. If a year later one or more tests need to be changed, the same engineer, or a different engineer, can quickly and easily make needed modifications to the cart's test program software. Test integrity is always ensured because test results are moved directly from the test cart's computer to off-site locations. This results in enormous savings in paperwork. Further, since the test cart assimilates many times the data formerly assimilated by using manual techniques in testing control surfaces, the cart provides a far better test, which results in improved quality of the final product.

BRIEF DESCRIPTION OF THE DRAWINGS

In the drawings, like reference numerals and letters refer to like parts throughout the various views except where otherwise indicated, and wherein:

FIG. 8 is to be viewed in conjunction with FIG. 7, and is the right-hand side of a schematic which shows the electrical interface between the test cart and the electronics and equipment bay of the airplane;

BEST MODE FOR CARRYING OUT THE INVENTION

INTRODUCTION

A test cart in accordance with the invention has been developed by The Boeing Company for performing all control surface functional tests on Boeing's 757 airplane. Briefly, and referring now to FIG. 1, which schematically indicates at 10 the various components making up the cart, the cart receives and measures electrical signal responses indicating movement of controls or control devices, which are normally operated by a pilot or first officer, and receives and measures electrical signal response indicating control surface movement of the airplane under test 12. This is handled per functional application software which is resident in a data acquisition computer 14 of the cart 10 at the time of testing. The cart also provides certain test stimuli, notably pneumatic stimuli, to the airplane under test for the purpose of operating control surfaces and simulating airspeed.

Figure 1:
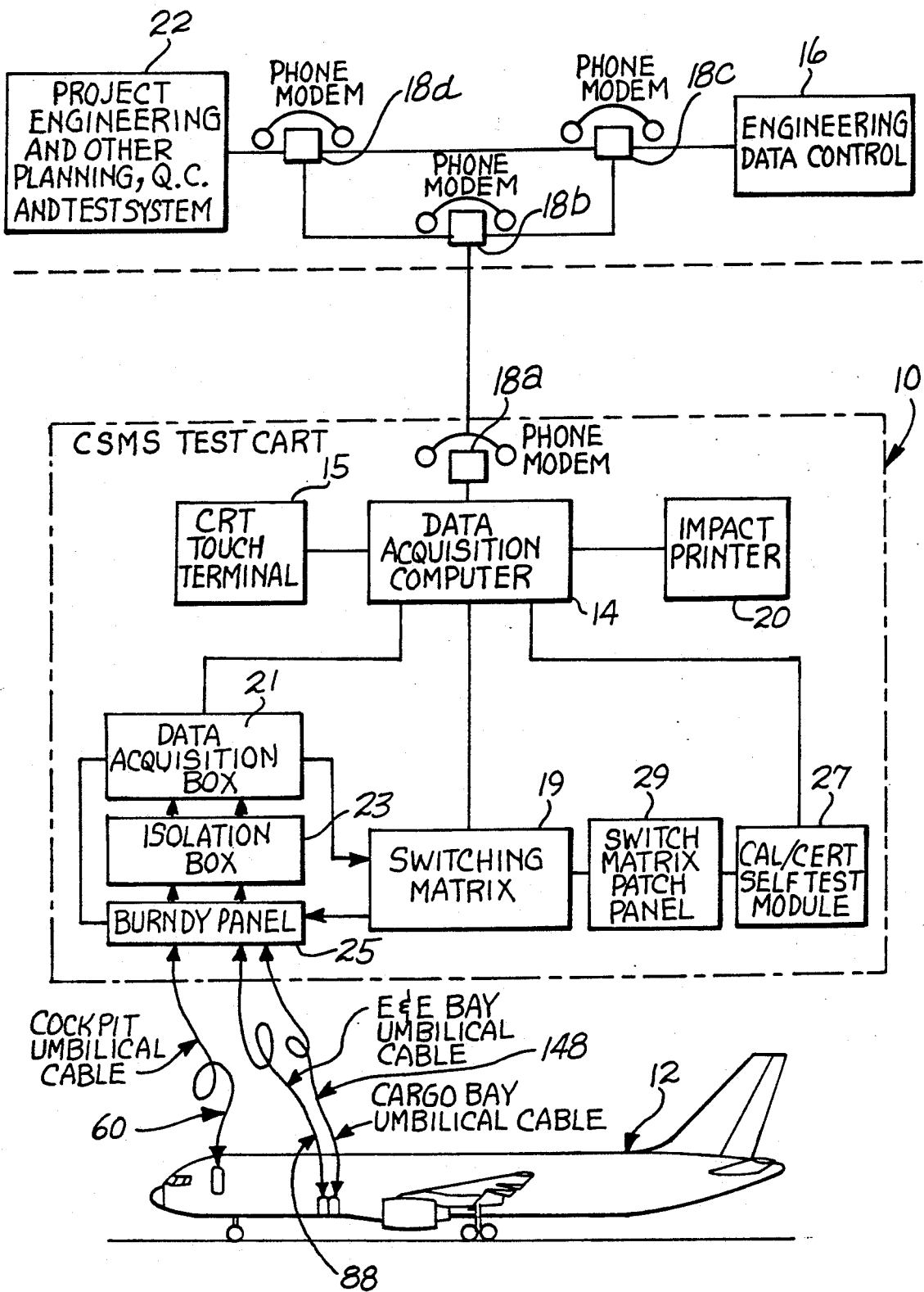
FIG. 1 is a block diagram of the various components in a test cart constructed in accordance with the invention, and shows related off-site equipment.

Test application software is downloaded to the test cart 10 from off-site engineering data control, indicated at 16 in FIG. 1. Generally, this is accomplished through conventional phone modems 18a–18d. Test results for a particular airplane functional test, i.e. pass or fail information, for example, may be printed by an impact printer 20 at the cart 10. Test data may also be made accessible to off-site engineering and other planning groups, including quality control 22.

The test cart 10 has a CRT touch terminal 15 which enables direct operator or user input at the CRT. Preferably, this terminal includes an analog color monitor equipped with a screen-mounted industrial touch controller, both of which would be familiar to the skilled person. For example, a color monitor of this type utilizes basic television receiver design principles to produce a raster-scan display. The monitor accepts external sync and separate red, green and blue video signal inputs formatted in accordance with EIA standard RS-170. The touch controller unit enables the user or operator to enter test commands or respond to prompting by simply touching the face of the CRT at the appropriate point on the picture displayed on its screen.

As mentioned above, the data acquisition computer 14, under the direction of an application software program, commands or controls test measurements as is schematically indicated in FIG. 1. Measurements are made directly through a data acquisition box 21 which processes data for linear variable differential transformers (LVDTs), rotational variable differential transformers (RVDTs), synchro, resolver, switching DC and DC analog signals. An isolation box 23 is used to isolate, scale, and condition signals only from LVDT/RVDTs in the airplane itself and in the cockpit interface equipment. All signals' are coupled from the airplane 12 under test via umbilicals to a burndy panel 25 on the cart, which is conventional in design. From here, synchro, DC analog, resolve and switching DC are connected to the data acquisition box 27.

The cart 10 also has a calibration/certification (CAL/CERT) module 27 operatively connected to the switching matrix 19 by means of a switch matrix patch panel 29. The CAL/CERT module is used to perform self-tests for the purpose of calibrating and certifying the accuracy of functional test performed by test cart equipment.

CART STIMULI/MEASUREMENT COMPONENTS

Figure 2:
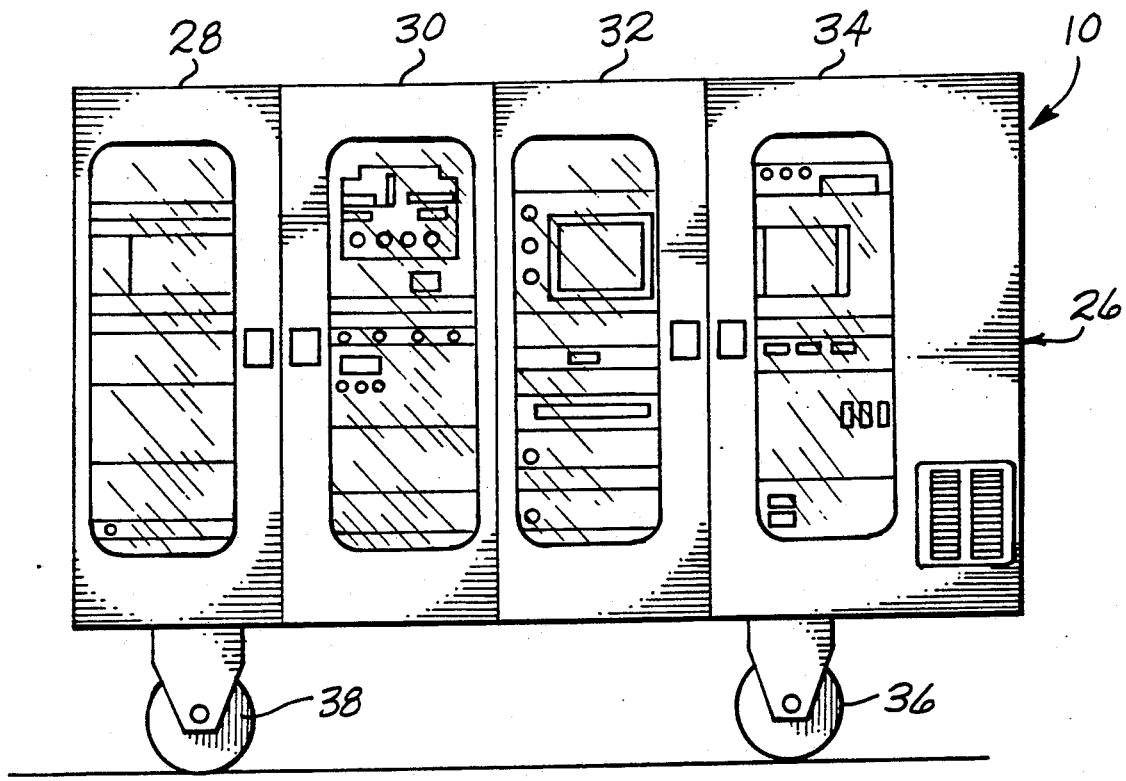
FIG. 2 is a frontal view of the test cart.
Figure 3:
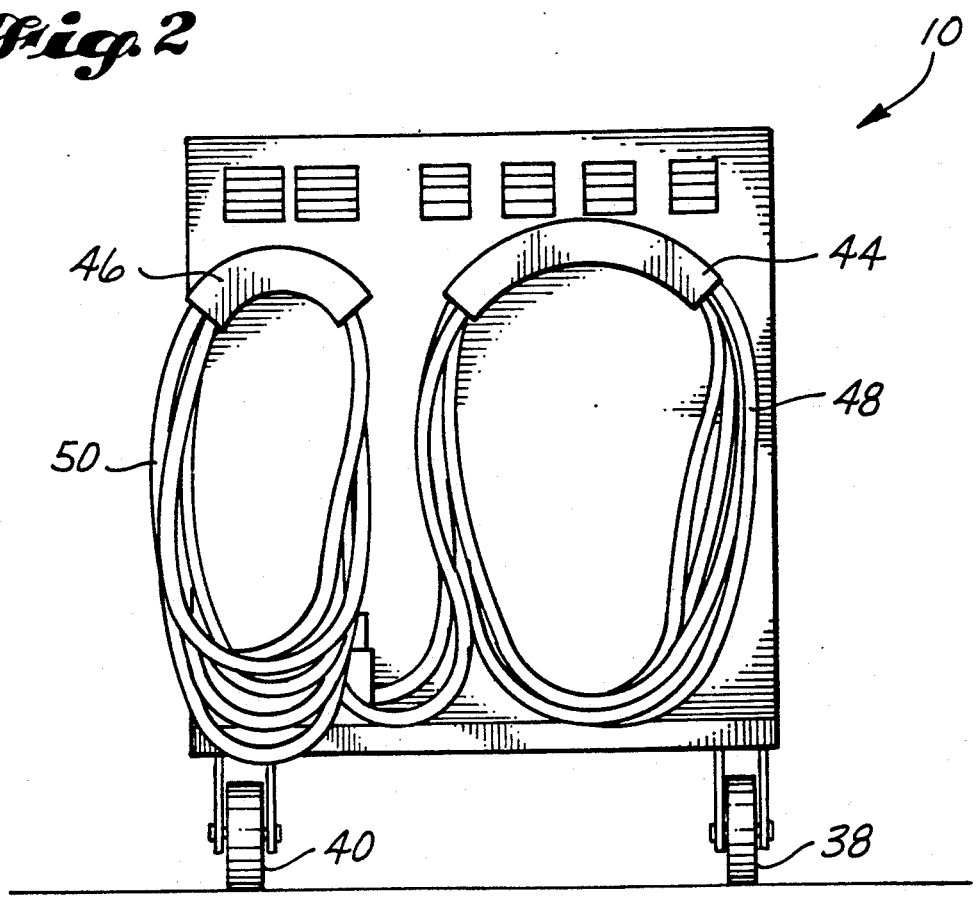
FIG. 3 is an end view of the test cart shown in FIG. 2, looking at its left-hand side.

Referring now to FIG. 2, there is shown the actual physical embodiment of the test cart 10 which consists of a wheeled housing 26 having four bays, each respectively indicated at 28, 30, 32, 34. Preferably, the housing 26 is made of metal and is mounted on four wheels 36, 38, 40, 42. The wheels facilitate test cart mobility from one location to another. Mounted to one side of the cart are supports 44, 46 for hanging umbilicals 48, 50 when the cart is not in use (see FIG. 3).

Figure 4:
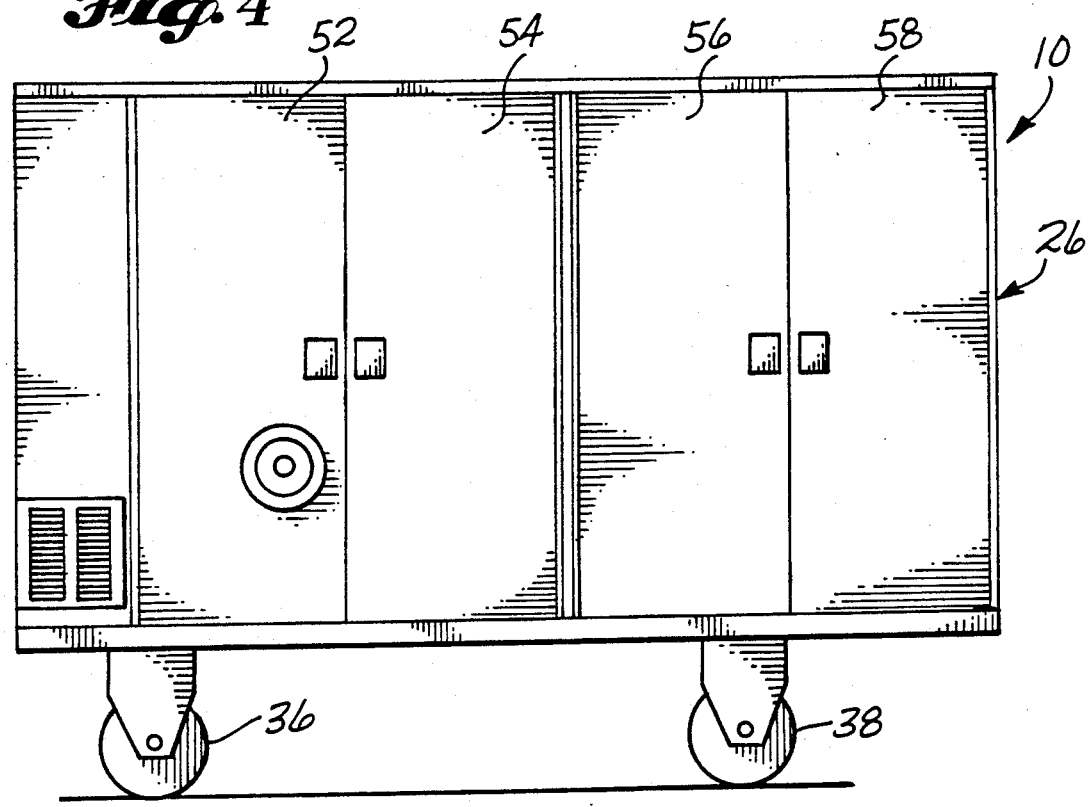
FIG. 4 is a rearward view of the test cart shown in FIGS. 2 and 3.
Figure 5:
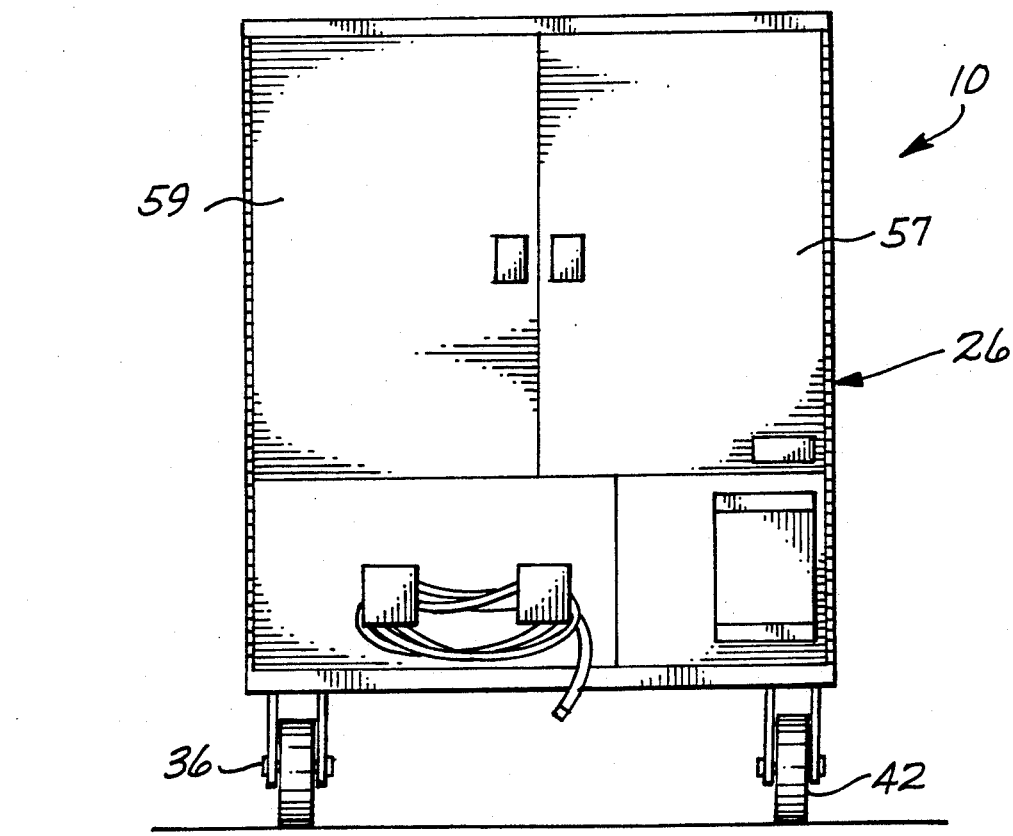
FIG. 5 is another end view of the test cart shown in FIGS. 2-4, but looking at its right-hand side.

The electronic equipment making up the test cart is mounted behind the doors of each cart bay 28, 30, 32, 34. Referring to FIG. 4, the cart 24 also has rearward doors 52, 54, 56, 58 which provide access to the back of the equipment in the bays, and also lead to additional component storage space. Referring to FIG. 5, the right-hand side of the cart's housing also includes doors 57, 59 which enclose additional storage space and power components.

The test cart 10 disclosed herein was developed over a period of several years until its final completion in or about November of 1988. As should be apparent by now, the cart involves practicing numerous complex technologies. The description which follows describes the major sections of the invention in a manner so that a person skilled in the art could ascertain how the test cart is made to work, and how it interfaces with various aircraft controls and control surfaces.

In the patent drawings which have been made part of this specification, and in particular, referring to FIGS. 6-12, certain plug numbers and select codes are identified which will not be specifically referred to herein. These are conventional, however, and direct the skilled person as to how the various components of the test cart are operatively linked together.

A critical part of the test cart 10 is the executive software which resides in the data acquisition computer 14. A microfiche appendix to the present specification contains the full complement of software tools which would be required to practice the invention.

AIRCRAFT INTERFACE EQUIPMENT

The test cart 10 includes certain airplane interface equipment consisting of certain instruments, cables, connection boxes, and adapters described below which are required to connect the cart 10 to the various airplane systems subject to test. This equipment is divided into three distinct categories: (1) cockpit interface equipment; (2) electrical and electronics (E&E) bay interface equipment; and (3) cargo bay interface equipment.

1. Cockpit Interface Equipment

Figure 6:
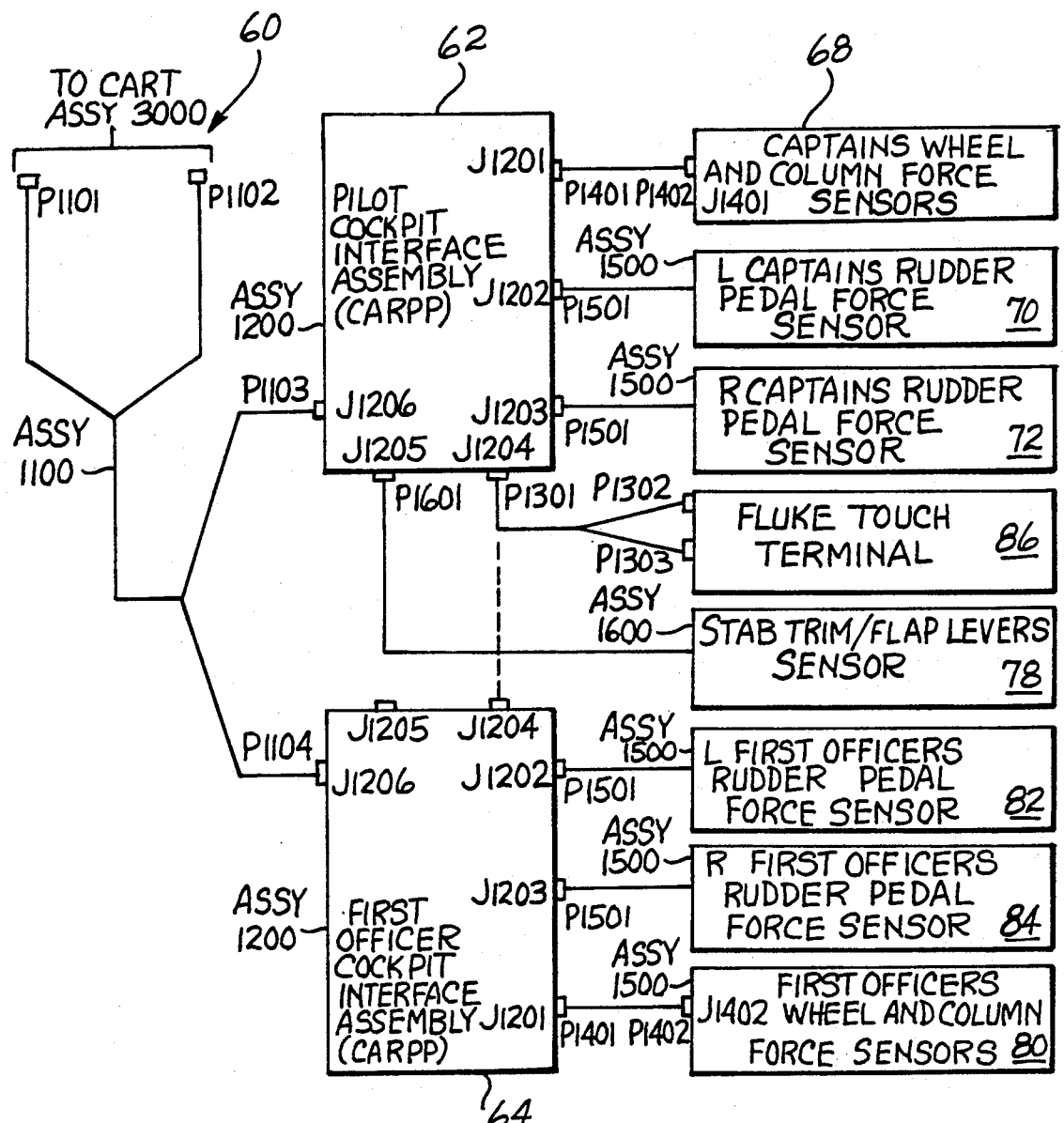
FIG. 6 is a schematic diagram showing how the test cart interfaces with controls in the cockpit of the airplane.

Referring to FIG. 6, the cockpit interface equipment consists of an umbilical cable, indicated generally at 60, which is connected to two cockpit interface boxes (CARPP) 62, 64. The CARPPs 62, 64 are further connected to certain sensors on the various cockpit controls or control devices. For example, one CARPP 62 is for pilot or captain controls, and the other 64 is for first officer controls. CARPP 62 is connected to (a) the captain's wheel and column force sensors 68, (b) the captain's left rudder pedal force sensor 70, (c) the captain's right rudder pedal force sensor 72, and (d) the stabilizer trim/flap lever sensor 78. Similarly, CARPP 64 is connected to the first officer's wheel and column force sensors 80, the first officer's left rudder pedal force sensor 82, and the first officer's right rudder pedal force sensor 84. A touch terminal 86 is operatively connected to the test cart 10 via at least one CARPP 62 and umbilical 60. The user or operator may use the touch terminal 86 while in the cockpit for the purpose of conducting various tests.

The two CARPP boxes 62, 64 are connected to the above-described cockpit controls by conventional electromechanical linkages. Signals from both the captain's and the first officer's sides are distributed from the CARPP boxes 62, 64 through the umbilical cable 60 to the test cart 10. As should be apparent, each of the two CARPP boxes 62, 64 are similar with the exception that one is for the captain's side and the other is for the first officer's side of the cockpit. Each box equates, through its control linkages, angular movement of rudder pedal and control column into varying sine wave signals. The linkages scale the airplane motion into the linear range of RVDT sine wave outputs. For example, as the captain's or first officer's control column is moved forward, a CARPP box linkage correspondingly moves. This turns a RVDT whose electrical output changes to reflect the new position. The connection of the CARPP box 62, 64 to rudder pedals is handled similarly.

The touch terminal 86 is of a type conventionally known and is used as a remote control unit in the cockpit. For example, a terminal which would be suitable for use in connection with the test cart is a Fluke Model FX 1780A terminal. It includes a green phosphor monitor having a touch screen assembly.

After the test cart 10 is started up, it may transfer control remotely to the touch terminal 86 in the cockpit. The terminal 86 enables the user to enter commands or respond to prompting from the cart's computer 14 by touching the face of the terminal 86 at the appropriate point on a picture displayed by the terminal. The test applications software pages instruction commands on the screen in sequential order. The terminal 86 also reports to the operator any problems as the test progresses. Software tools to do this are provided by the executive software of the microfiche appendix.

The wheel and column force sensors for both captain and first officer 68, 80 can be installed on either the captain's control wheel or the first officer's control wheel as requested by the applications software. Wheel and column testing is accomplished by mounting a dummy wheel to the control column. Rotating the dummy wheel in either direction distorts a wheel force strain gauge bridge, which produces an unbalanced bridge output signal. The magnitude of the signal difference is directly proportional to the amount of force applied to the dummy control wheel. The polarity indicates the direction of the force. Push/pull force on the control wheel and column causes an internal column force strain gauge bridge to be distorted, thereby producing an unbalanced bridge output signal. The magnitude of the signal difference between unbalanced signals is also directly proportional to the amount of force applied to the control column, and the polarity indicates the direction of force.

2. E&E Bay Interface Equipment

Figure 7:
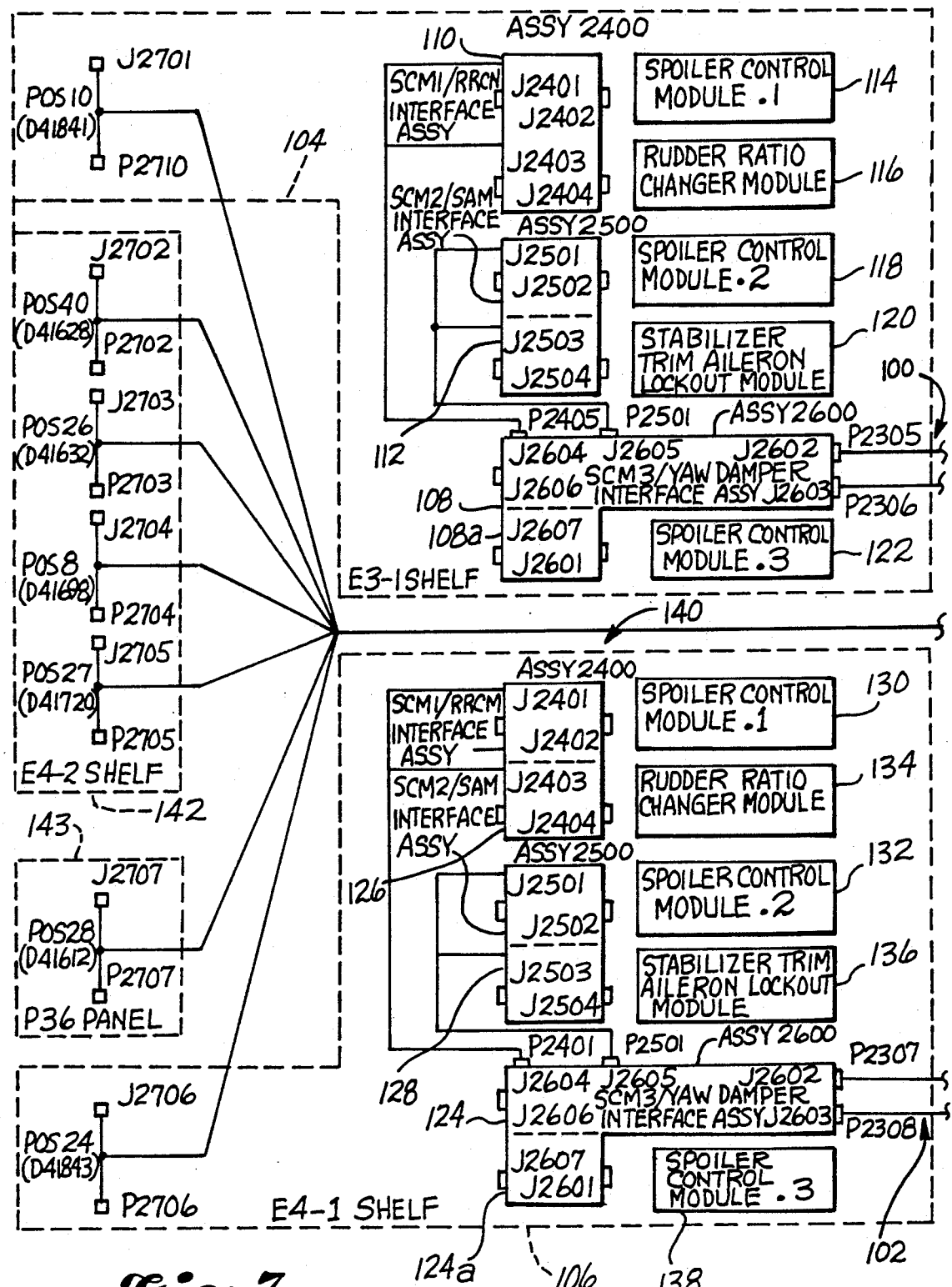
FIG. 7 is to be viewed in conjunction with FIG. 8, and is the left-hand side of a schematic which shows the electrical interface between the test cart and the electronics and equipment bay of the airplane.
Figure 6:
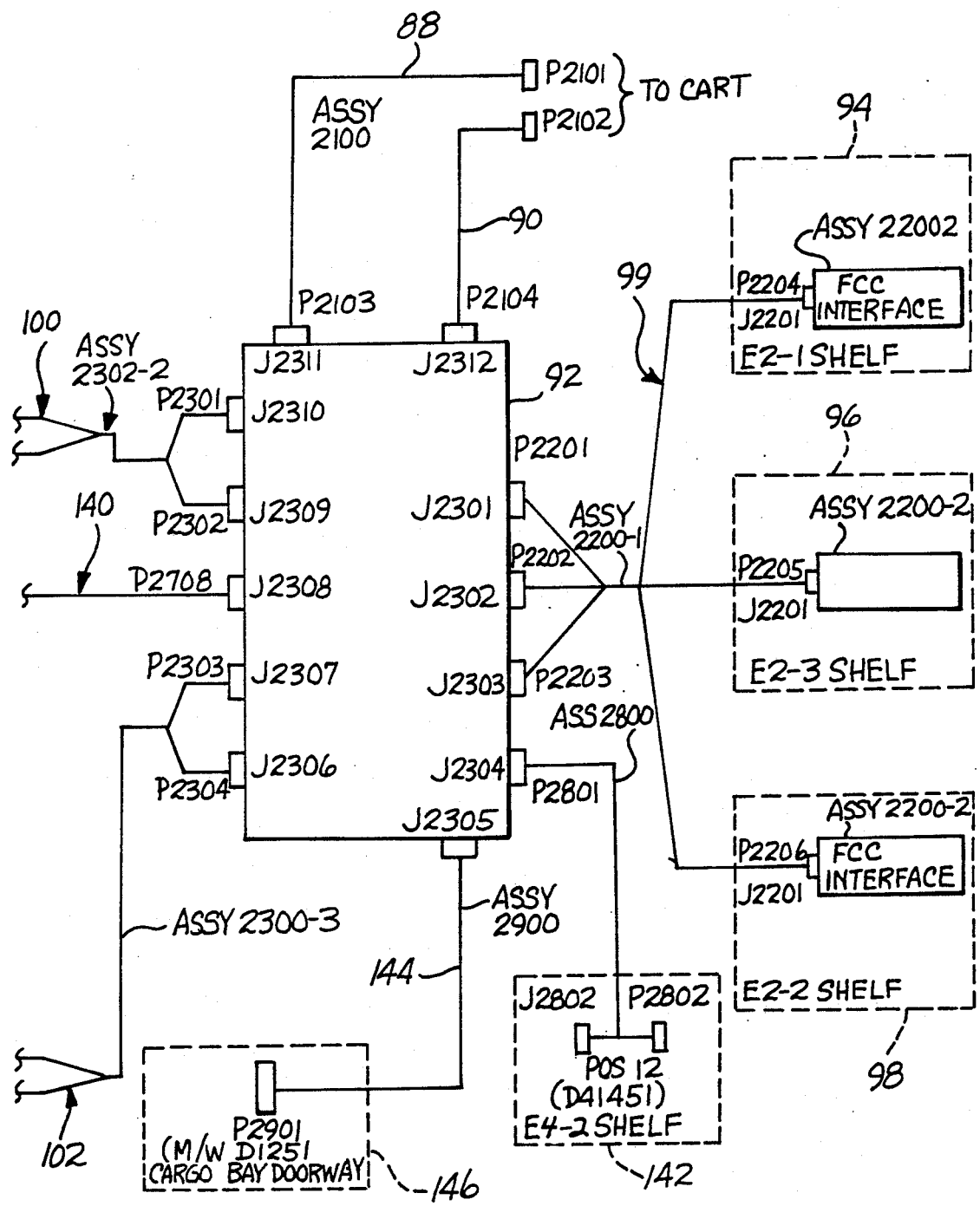
Figure 9:
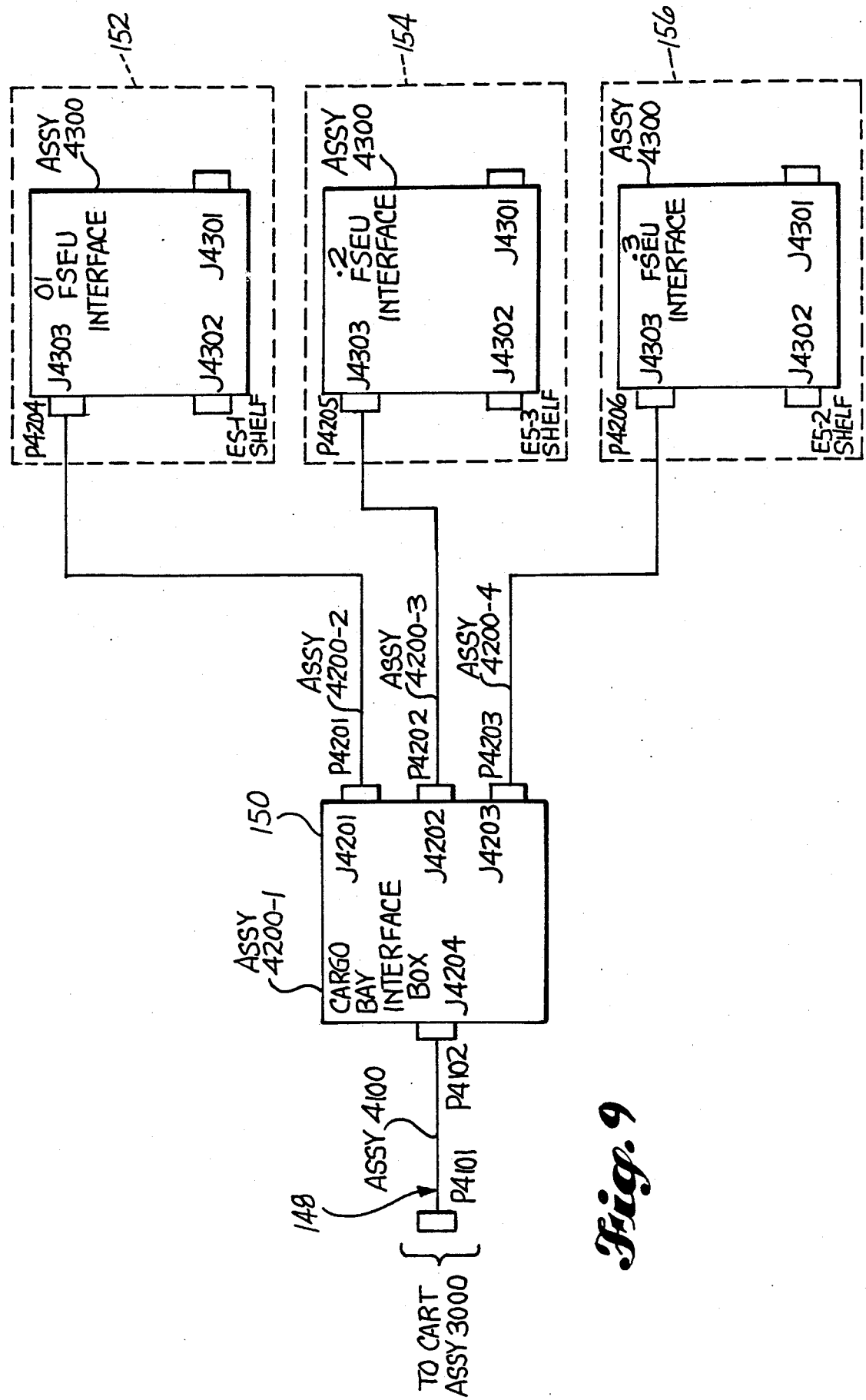
FIG. 9 is a schematic drawing showing how the test cart interfaces with the cargo bay of the airplane.

Referring to FIGS. 7-9, and first to FIG. 8, the electrical and electronics (E&E) bay interface equipment includes two E&E bay umbilical cables which are indicated at 88, 90, respectively. These cables 88, 90 connect the test cart 10 to an E&E bay interface box 92 that is further connected to and receives signals from the E2, E3, and E4 shelves in the E&E bay. Reference numerals 94, 96, 98 schematically indicate connections to the E2 shelf. There, L, R and C FCC signals are transmitted between the E2-1, E2-2, and E2-3 shelves to the E&E bay interface box 92 by cable assembly 99.

The E&E bay interface box 92 is further connected by cable assemblies 100, 102, respectively, to the E3 and E4 shelves (see FIG. 7) 104, 106. More particularly, cable assembly 100 connects to the SCM3/yaw damper interface box 108 on the E3-1 shelf. Two interface assembly boxes 110, 112 (SCM1/RRCM interface assembly and SCM2/SAM interface assembly) which are similar, and are connected to the SCM3/yaw damper interface box 108, provides wiring paths to open, reconnect and measure electrical signals. Box 110 provides this function for the airplane's spoiler control module No. 1, 114 and the rudder ratio changer module 116. The other interface assembly box 112 provides the same function for signals from spoiler control module No. 2, 118, and the stabilizer/trim aileron lockout module 120. The SCM3/yaw damper interface box 108 provides this function for signals from spoiler module No. 3, 122.

The E4-1 shelf 106 has essentially the same components as those which were described above for the E3-1 shelf 104. That is, cable assembly 102 ties the E&E bay interface box 92 (see FIG. 8) to the SCM3/yaw damper interface assembly box 124 on the E4-1 shelf. An SCM1/RRCM interface assembly box 126 and an SCM2/SAM interface assembly box 128 respectively provide wiring paths to open, reconnect and measure signals from first and second spoiler control modules 130, 132, a rudder ratio changer module 134, and a stabilizer/trim aileron lockout module 136 as indicated, all of the latter being located on the E4-1 shelf. The SCM3/yaw damper interface box 124 also has a portion 124a serving a similar function for the third spoiler control module 138.

Another cable assembly 140 interconnects the E&E bay interface box 92 with the E3-1, E4-1 and E4-2 shelves 104, 106, 142 (see FIG. 7), and the P36 panel 143. This serves to provide wiring paths to open, reconnect and measure synchro and test signals. The E&E bay interface box 92 is further connected by cable 144 to the cargo bay doorway 146.

3. Cargo Bay Interface Equipment

Referring now to FIG. 9, the test cart 10 is connected by means of umbilical cable 148 to a cargo bay interface box 150. This box 150 further connects the cart to, and receives signals from three FSEU interface assemblies 152, 154, 156 which are on the E5 shelf in the cargo bay. These assemblies 152, 154, 156 provide a way to open, reconnect and measure FSEU signals.

TEST CART CONTROL GROUP

Figure 10:
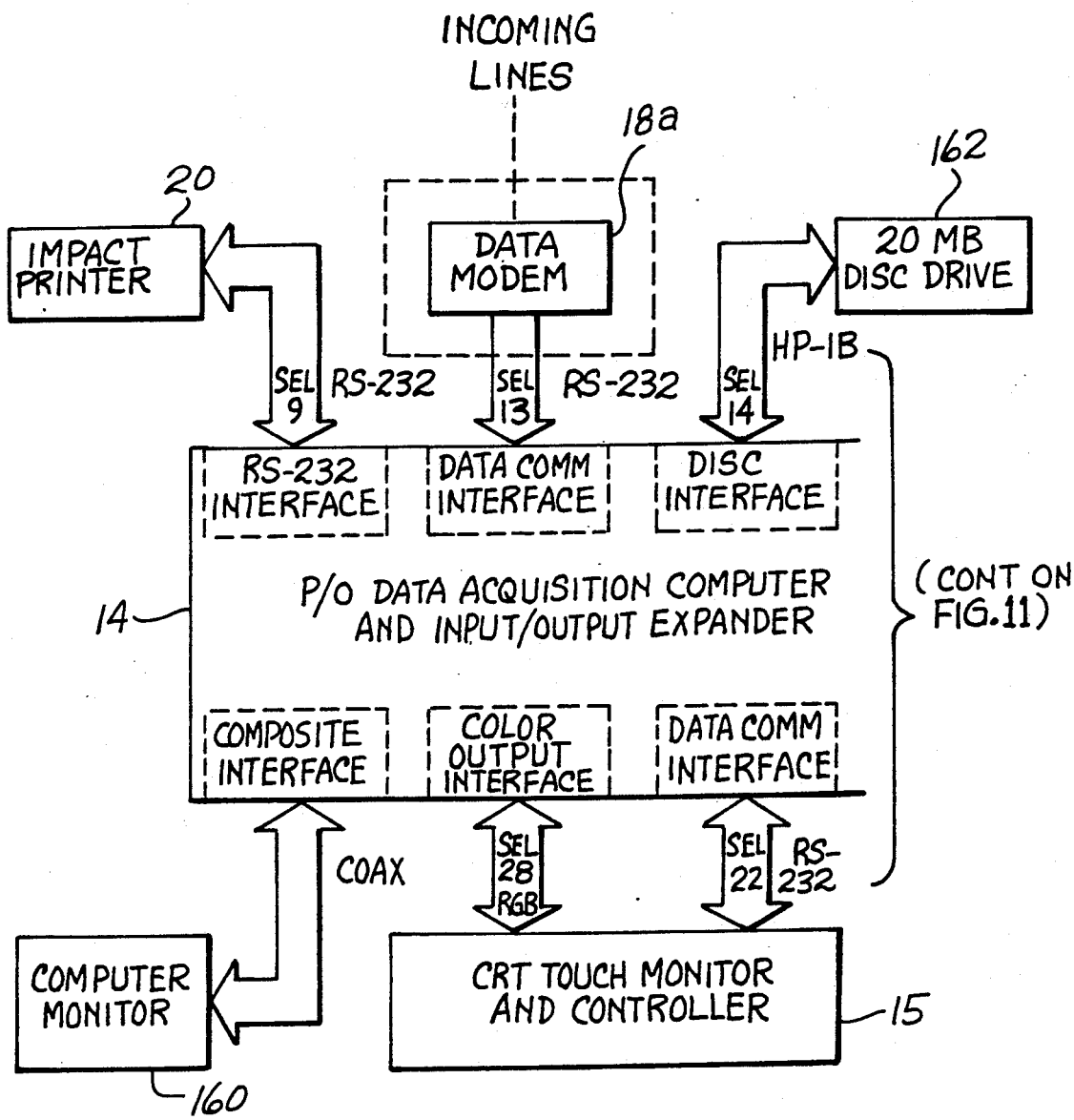
FIG. 10 is to be viewed in conjunction with FIGS. 11 and 12 and is the left-hand portion or sheet of a schematic flow diagram showing test cart operation.

The test cart 10 has a control group of components consisting of equipment that enables the cart user to start and control particular test programs. Referring to FIG. 10, the control group generally consists of the cart's data acquisition computer 14, and certain operator interface devices such as the CRT touch monitor and controller 15, a separate computer monitor 160, the impact printer 20, and the phone modem 18a.

The data acquisition computer 14 and its peripheral equipment are the central controller for the test cart. The computer 14, under the direction of the application software and using software tools located in the executive software (in the microfiche appendix), commands stimulus measurement equipment to collect and process data. Programmable stimulus and measurement equipment are selectively addressed by their own device addresses. This is in the form of certain select codes, i.e. SELXX, which would be familiar to a person skilled in the art.

The computer 14 preferably has a 20-megabyte disk drive 162 which provides ample storage capabilities and flexibility. One of the input/output devices is a computer keyboard 164 (see FIG. 11). The keyboard 164 and monitor 160 enables the operator to insert and view data, program listings, error messages, and system comments. The impact printer 20 is operatively connected for printing hard copies of this information if desired. The CRT touch terminal 15 is used primarily for test selection and error displaying. The interfaces between the computer and these various input/output devices is accomplished by conventional computer accessory slots which interface with the peripheral equipment. They maintain line protocol, receive data and send equipment control signals. This, of course, would be familiar to a person skilled in the art.

The 20-megabyte disk drive 162 is of conventional design and may contain both a double-sided flexible (floppy) disc drive and a fixed (hard) disc drive. The floppy discs would be used for temporary file transfer and scratch pad writing. The hard disc would be used for storage of executive software, functional test files and data.

The impact printer 20 is preferably rack-mountable and provides hard copy printout capability for the computer 14. The monitor 160 or data acquisition monitor 160, provides real time visual display of computer operations. Preferably, it would be conventional in design, having a non-glare 14-inch screen and an 80-character by 24-line video display.

The control group also has a clock/timer module 166 (see FIG. 11), which provides a means of generating time and date readings at any desired point in a test program. In addition, single or multiple interupts can be generated at accurately-timed intervals, if desired, and the module can be used as a timer of certain test cart tasks as a precision alarm clock.

The control group also has a voice generator module 168 which provides the test cart with the capability to output certain desired information in an intelligible voice and/or produce warning tones. Preferably, the generator is of a type which utilizes synthesis-by-rule algorithms instead of stored speech and therefore has an unlimited vocabulary. The input to this type of generator is plain English text in ASCII form, and the output is normal-sounding speech. Abbreviations and symbols may be expanded to generate speech that sounds like that which one would expect from a speaker. Although not really necessary, amplitude, pitch, speech rate and other speech characteristics can be altered in order to take advantage of the special needs corresponding to the unique characteristics of various kinds of control commands. An intercom speaker 170 of conventional design is used in conjunction with the voice generator.

Figure 11:
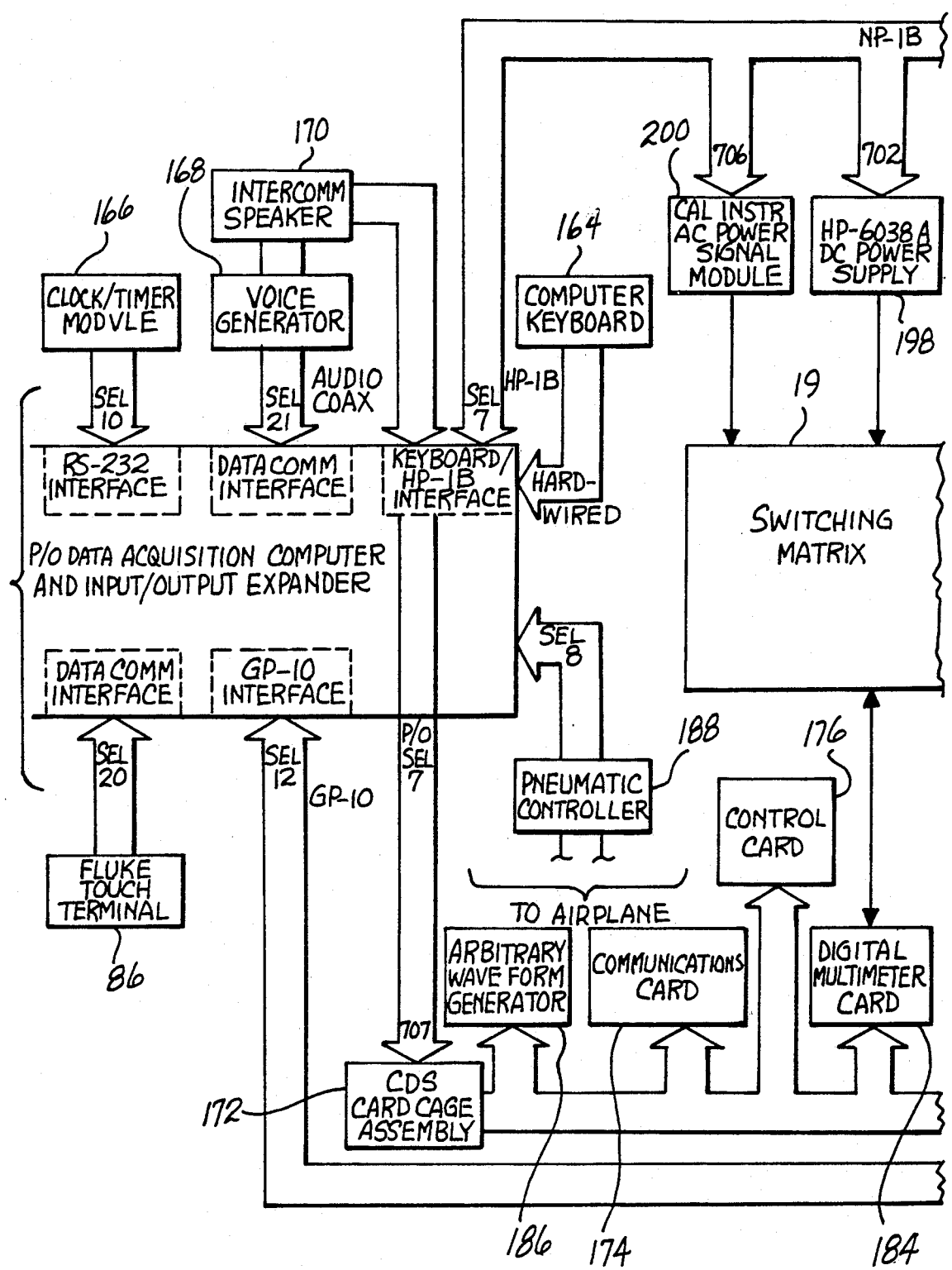
FIG. 11 is to be viewed in conjunction with FIGS. 10 and 12 and is the central portion or sheet of a schematic flow diagram of the test cart.

Referring to FIG. 11, a card cage assembly 172, which is a bus instrument, provides direct connection from the test cart computer 14 through one of the computer's input/output ports. This assembly is a card cage of conventional design that is completely interfaced to the computer 14 and contains the following "Instrument-on-a-card" modules:

1. One communications card type 53A-128 which allows the system to function as a programmable instrument on any IEEE-488 bus. This is indicated at 174 in FIG. 11.
2. One control card 53A-171 which identifies system level commands, provides local card address control, initiates timing signals, checks local cards for interrupts, and reports vectored priority interrupts to the computer. This is indicated at 176 in FIG. 11.
3. Two relay driver cards, indicated at 178 in FIG. 12, each with 40 output drivers to control remote relays. These cards are conventional and allow the location of relay switches close to the airplane so that test signal cable runs can be kept as short as possible.
4. One presorting ARINC-429 receiver card 180 (see FIG. 12) which receives data from a digital information transfer system (DITS) and reformats the data into three 8-bit bytes for the computer 14.

5. A universal ARINC-429 transmitter/pacer card combination 182 (see FIG. 12) which is used to convert engineering data into ARINC-429 format. For example, the computer 14 outputs three 8-bit bytes with a label to the card which reformats the data into a 32-bit serial word for the DITS bus. The transmitter card 182 has RAM that stores up to 64 messages and retransmits them at pre-programmed time intervals which are controlled by the pacer card. The pacer card also allows for programming the data bit rates which are to be transmitted.

6. One digital multi-meter card 184 (see FIG. 11) having four programmable measurement functions—DC voltage, true RMS AC voltage, and two or four-wire ohms.

7. One arbitrary wave-form generator 186 (FIG. 11) which is used in conjunction with the airplane's autopilot subsystem. This card 186 provides control signals to the airplane autopilot control servos.

The test cart 10 has a pneumatic controller 188 operatively linked to the data acquisition computer 14. This controller provides precise and stable pressure control that simulates and accurately measures the pneumatic pressures representative of an airplane in flight. Pressure measurement and control is provided in terms of inches of mercury or millibars; altitude in feet or meters; and airspeed in knots or kilometers/hour which is selected by the test cart user.

SWITCHING GROUP

The test cart also has a switching group or switching matrix 19. This group switches various signals used in airplane control surface testing. The basic switching matrix configuration 19 is a 200-latch point, 10-switch module, standard control chassis with expansion interface. The expansion chassis is configured for 400 (maximum) latch points, 20-switch modules for each unit. Both are modular in construction, and have a mother board backplane to minimize servicing and improve system signal characteristics.

The data acquisition computer 14 and switching matrix 19 also control the output of a variable DC power supply 198 and a variable AC power supply 200. The DC power supply 198 is an interface bus programmable unit that provides at least 200 watts output power over a wide range of output voltage and current combinations. The AC power supply 200 provides programmable control of 0 to 135 volts amplitude, at 45 to 5 K hertz.

CALIBRATION/CERTIFICATION SELF-TEST MODULE

Figure 12:
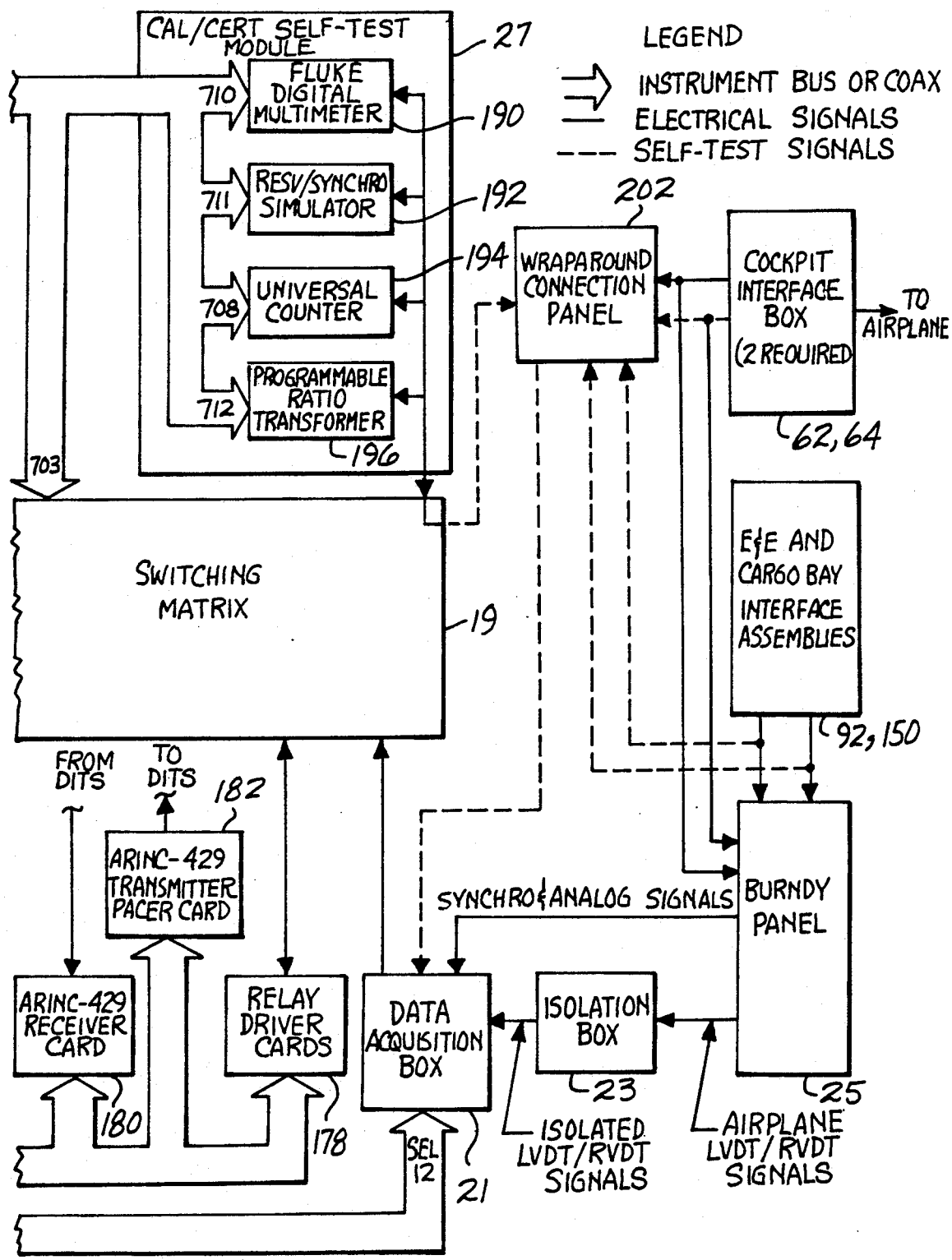
FIG. 12 is to be viewed in conjunction with FIGS. 10 and 11, and is the right-hand portion or sheet of a schematic flow diagram of the test cart.

Referring to FIG. 12, the test cart 10 has a calibration/certification (CAL/CERT) self-test module 27. The purpose of this module is to perform self-tests on the test cart for the purpose of calibrating and certifying the accuracy of functional tests performed by the test cart equipment. Four instruments are included in this module which are calibrated frequently, and are used as standards for other cart instruments and measurements. One of such instruments is a digital multimeter 190 which measures true RMS AC voltage, DC voltage, current, and resistance, preferably with three reading rates. The second is a resolver/synchro simulator 192 that is used for production testing, numerical control and simulation of resolvers and synchros. The third is a universal counter 194 which measures signals over a range of DC to 100 MHz. This instrument measures frequency, time interval, time interval average, time interval hold-off (delay) and ratio. Lastly, a programmable ratio transformer 196 is rack-mounted in the module 27 and provides precision AC inputs or may be used as a precision AC voltage divider for making ratio measurements.

A wrap-around connection panel 202 receives the airplane-end plugs of the cockpit umbilical cable 60, cargo bay umbilical cable 148, and E&E bay umbilical cable 88 for wrap-around self-testing. Normally, airplane signals are coupled to the data acquisition box 21 for processing. In the wrap-around self-test mode, simulated airplane signals are generated by the CAL/CERT module 27 and sent via the umbilical cables to the data acquisition box for processing.

After considering the preceding description, it should be apparent to the skilled person that the invention described herein could be modified in many ways without departing from the overall spirit and scope of the invention. The invention is not to be limited by the preceding description. Instead, the invention is to be limited only by the subjoined patent claims wherein such claims are to be interpreted in accordance with the well-established doctrines of patent claim interpretation.

What is claimed is:

1. For use in connection with an aircraft having pilot or autopilot aircraft control devices connected to certain aircraft flight control surfaces including ailerons, rudder, elevators, spoilers, stabilizer and flaps/slats, wherein during flight said flight control surfaces move in response to movements of said control devices, a test cart for automated on-ground testing of flight control surface responsiveness to said movements of said control devices, comprising:

a data acquisition computer;

command sensing means, operatively connecting said computer to said aircraft control devices, for sensing both movements of said control devices and forces acting on said control devices;

surface movement sensing means, operatively connecting said computer to said aircraft flight control surfaces, for sensing responsive movements of said flight control surfaces to movements of said aircraft control devices; and programming means operable to cause said data acquisition computer to receive from said command sensing means said sensed control device movements and said forces acting on said control devices, and operable to cause said data acquisition computer to receive from said surface movement sensing means said sensed responsive flight control surface movements, and operable to assimilate said sensed control device movements, said sensed forces acting on said control devices and said sensed responsive flight control surface movements into test data.

2. The test cart as set forth in claim 1, wherein said control surface responsiveness to a particular movement of one of said control devices varies as a function of aircraft speed, and wherein said test cart includes means, operated by said data acquisition computer, for simulating airspeed so that said control surface responsiveness reflects actual flight conditions.

3. The test cart as set forth in claim 1, including at least one CRT touch terminal operatively connected to said data acquisition computer, for permitting a test cart user to input and receive test information.

4. The test cart as set forth in claim 3, wherein said at least one CRT touch terminal is normally located in the cockpit of said aircraft.

5. The test cart as set forth in claim 1, including an intercom system operatively connected to said data acquisition computer, for permitting communication between one test cart user and another user.

6. The test cart as set forth in claim 5, wherein said programming means of said computer further includes voice synthesizer means causing said intercom system to provide said one test cart user certain audible warnings when one of said control surfaces under test is about to be moved.

7. The test cart as set forth in claim 1, including a wheeled housing in which said data acquisition computer is housed.

8. The test cart as set forth in claim 1, including a modem for connecting said data acquisition computer to a remote location.

9. The test cart as set forth in claim 1, wherein said control devices include at least a captain's control column and wheel, and a captain's left rudder pedal and right rudder pedal, said control devices being located in the cockpit of said aircraft, and wherein said command-sensing means includes sensors operative to output electrical signals indicating movement of and forces acting on said control devices, said test cart further including umbilical means for electrically connecting said test cart to said command-sensing means, and cockpit interface assembly means for connecting said umbilical means to said sensors of said command-sensing means.

10. The test cart as set forth in claim 1, including umbilical means for electrically connecting said test cart to an electrical and electronics bay of said aircraft.

11. The test cart as set forth in claim 1, including umbilical means for electrically connecting said test cart to a cargo bay of said aircraft.

12. The test cart as set forth in claim 1, including remotely-located data storage means, operatively connected to said data acquisition computer, for receiving and storing said test data assimilated by said computer.

13. The test cart as set forth in claim 1, wherein said programming means is further operable to cause said data acquisition computer to assimilate said sensed control device movements, said sensed forces acting on said control devices and said sensed responsive flight control surface movements into test data for a range of movements of said control devices.

14. The test cart as set forth in claim 1, wherein said programming means is further operable to cause said data acquisition computer to assimilate said sensed control device movements, said sensed forces acting on said control devices and said sensed responsive flight control surface movements into test data for a range of movements of said flight control surfaces.

* * * * *